United States Patent
Kato

(10) Patent No.: US 10,474,178 B2
(45) Date of Patent: Nov. 12, 2019

(54) POWER MODULE AND AIR CONDITIONER

(71) Applicant: Masahiro Kato, Tokyo (JP)

(72) Inventor: Masahiro Kato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 345 days.

(21) Appl. No.: 13/727,215

(22) Filed: Dec. 26, 2012

(65) Prior Publication Data
US 2013/0214746 A1 Aug. 22, 2013

(30) Foreign Application Priority Data

Feb. 17, 2012 (JP) ................................. 2012-032849

(51) Int. Cl.
G05F 1/70 (2006.01)
H02M 1/42 (2007.01)

(52) U.S. Cl.
CPC ............... *G05F 1/70* (2013.01); *H02M 1/42* (2013.01); *H01L 2224/0603* (2013.01); *H01L 2224/48091* (2013.01); *H01L 2224/48137* (2013.01); *H01L 2224/48247* (2013.01); *H01L 2924/1301* (2013.01); *H01L 2924/1305* (2013.01);
(Continued)

(58) Field of Classification Search
CPC .... G05F 1/70; H02M 1/42; H01L 2224/0603; H01L 2224/48091; H01L 2224/48137; H01L 2224/48247; H01L 2924/1301; H01L 2924/1305; H01L 2924/13055; H01L 2924/13091
See application file for complete search history.

(56) References Cited

U.S. PATENT DOCUMENTS 7,164,591 B2 * 1/2007 Soldano .............. H02M 1/4225
363/89
7,382,198 B2 6/2008 Nakamura et al.
7,639,520 B1 * 12/2009 Zansky et al. .................. 363/65
(Continued)

FOREIGN PATENT DOCUMENTS

CN 1848668 A 10/2006
EP 1198058 A1 4/2002
(Continued)

OTHER PUBLICATIONS

Wiley, Steven M., Wiley Electrical and Electronics Engineering Dictionary, John Wiley & Sons, Inc., 2004, pp. 480 and 547.*
(Continued)

*Primary Examiner* — Nguyen Tran
*Assistant Examiner* — Monica Mata
(74) *Attorney, Agent, or Firm* — Studebaker & Brackett PC

(57) ABSTRACT

A power module is a power module having a PFC (power factor correction) function. The power module includes: IGBTs in a pair; first diodes in a pair connected to the IGBTs in a pair, the first diodes forming a reverse-conducting element; and second diodes in a pair connected to the IGBTs in a pair, the second diodes having a rectifying function. The power module further includes a driving IC that drives the IGBTs in a pair, and P terminals in a pair provided independently of each other. The P terminals are connected to one ends of the first diodes in a pair, respectively, the one ends being opposite to the other ends of the first diodes to which the IGBTs in a pair are connected.

16 Claims, 6 Drawing Sheets

(52) U.S. Cl.
CPC .............. *H01L 2924/13055* (2013.01); *H01L 2924/13091* (2013.01)

(56) References Cited

U.S. PATENT DOCUMENTS

| | | | |
|---|---|---|---|
| 8,338,255 B2 | 12/2012 | Cheng | |
| 2005/0105311 A1 | 5/2005 | Soldano | |
| 2006/0139020 A1* | 6/2006 | Wood et al. | 323/283 |
| 2006/0244540 A1 | 11/2006 | Nakamura et al. | |
| 2008/0018312 A1* | 1/2008 | Dowlatabadi | 323/271 |
| 2009/0206809 A1* | 8/2009 | Koo et al. | 323/282 |
| 2010/0019742 A1* | 1/2010 | Li | H02M 7/53871 323/234 |
| 2010/0320530 A1 | 12/2010 | Cheng | |
| 2011/0031943 A1* | 2/2011 | Green | 323/205 |
| 2011/0032738 A1* | 2/2011 | Skinner et al. | 363/126 |
| 2011/0216558 A1 | 9/2011 | Uno | |
| 2011/0316514 A1* | 12/2011 | Deboy | H02M 3/1584 323/312 |
| 2013/0009169 A1 | 1/2013 | Cheng | |
| 2014/0119074 A1* | 5/2014 | Courtney et al. | 363/70 |

FOREIGN PATENT DOCUMENTS

| | | |
|---|---|---|
| JP | 2510618 B2 | 6/1996 |
| JP | 2008-306779 A | 12/2008 |
| JP | 2009-110981 A | 5/2009 |
| JP | 2009-261106 A | 11/2009 |
| WO | 01/73933 A1 | 10/2001 |
| WO | 2005/033819 A2 | 4/2005 |
| WO | 2010/148271 A2 | 12/2010 |

OTHER PUBLICATIONS

The first Office Action issued by the Chinese Patent Office dated Oct. 21, 2014, which corresponds to Chinese Patent Application No. 201210557699.2 and is related to U.S. Appl. No. 13/727,215; with English language translation.

The second Office Action issued by the Chinese Patent Office dated Jun. 16, 2015, which corresponds to Chinese Patent Application No. 201210557699.2 and is related to U.S. Appl. No. 13/727,215; with English language partial translation.

An Office Action: "Notice of Reasons for Rejection," issued by the Japanese Patent Office dated May 12, 2015, which corresponds to Japanese Patent Application No. 2012-032849 and is related to U.S. Appl. No. 13/727,215; with English language partial translation.

A Search Report issued by the Patent Office of the People's Republic of China which corresponds to Patent Application No. 201210557699.2 and is related to U.S. Appl. No. 13/727,215; with English language partial translation.

A Fourth Office Action by the Chinese Patent Office dated Jul. 14, 2016, which corresponds to Chinese Patent Application No. 201210557699.2 and is related to U.S. Appl. No. 13/727,215; with English language partial translation.

Office Action issued by the Chinese Patent Office dated Feb. 9, 2017, which corresponds to Chinese Patent Application No. 201210557699.2 and is related to U.S. Appl. No. 13/727,215; with English language partial translation.

Office Action issued by the Chinese Patent Office dated Feb. 9, 2017, which corresponds to Chinese Patent Application No. 201210557699.2 and is related to U.S. Appl. No. 15/180,759; with English language partial translation.

An Office Action issued by the Chinese Patent Office dated Feb. 9, 2017, which corresponds to Chinese Patent Application No. 201210557699.2 and is related to U.S. Appl. No. 13/727,215; with partial English language translation.

An Office Action issued by the Chinese Patent Office (SIPO) dated Nov. 9, 2017, which corresponds to Chinese Patent Application No. 201210557699.2 and is related to U.S. Appl. No. 13/727,215; with English language translation.

Examination Decision of the Patent Reexamination Board issued by the State Intellectual Property Office of the People's Republic of China dated Mar. 28, 2018, which corresponds to Chinese Patent Application No. 201210557699.2 and is related to U.S. Appl. No. 13/727,215; with partial English translation.

* cited by examiner

POWER MODULE AND AIR CONDITIONER

BACKGROUND OF THE INVENTION

Field of the Invention

The present invention relates to a power module having a PFC (power factor correction) function to correct a power factor, and an air conditioner provided with the power module.

Description of the Background Art

A power module having a PFC function to correct a power factor has been known to enhance efficiency in the use of electric power.

A suggested structure of this power module follows a relationship of elements connected to each other described in Japanese Patent Application Laid-Open No. 2009-110981. To be specific, this suggested structure includes semiconductor switching elements in two phases (semiconductor switching elements in a pair), diodes in a pair connected to the semiconductor switching elements in corresponding phases, and a terminal (P terminal) to which the diodes in a pair are commonly connected.

The aforementioned structure where the semiconductor switching elements in two phases share one terminal (P terminal) makes an impedance relatively high that is common to the semiconductor switching elements in two phases, and generates a phenomenon of serious oscillation in the power module. This results in a problem in that the oscillation phenomenon increases noise between the gates and the emitters of the semiconductor switching elements in two phases during high-speed switching.

SUMMARY OF THE INVENTION

It is an object of the present invention to provide technique capable of suppressing noise to be generated in semiconductor switching elements in a pair.

The present invention is intended for a power module having a PFC (power factor correction) function. The power module includes: semiconductor switching elements in a pair; first diodes in a pair connected to the semiconductor switching elements in a pair, the first diodes forming a reverse-conducting element; and second diodes in a pair connected to the semiconductor switching elements in a pair, the second diodes having a rectifying function. The power module further includes a driving part that drives the semiconductor switching elements in a pair, and terminals in a pair provided independently of each other. The terminals are connected to one ends of the first diodes in a pair, respectively, the one ends being opposite to the other ends of the first diodes to which the semiconductor switching elements in a pair are connected.

The semiconductor switching elements in a pair are connected through the first diodes in a pair to the terminals in a pair. This allows reduction of a common impedance acting on the semiconductor switching elements in a pair, leading to suppression of noise to be generated in the semiconductor switching elements in a pair.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
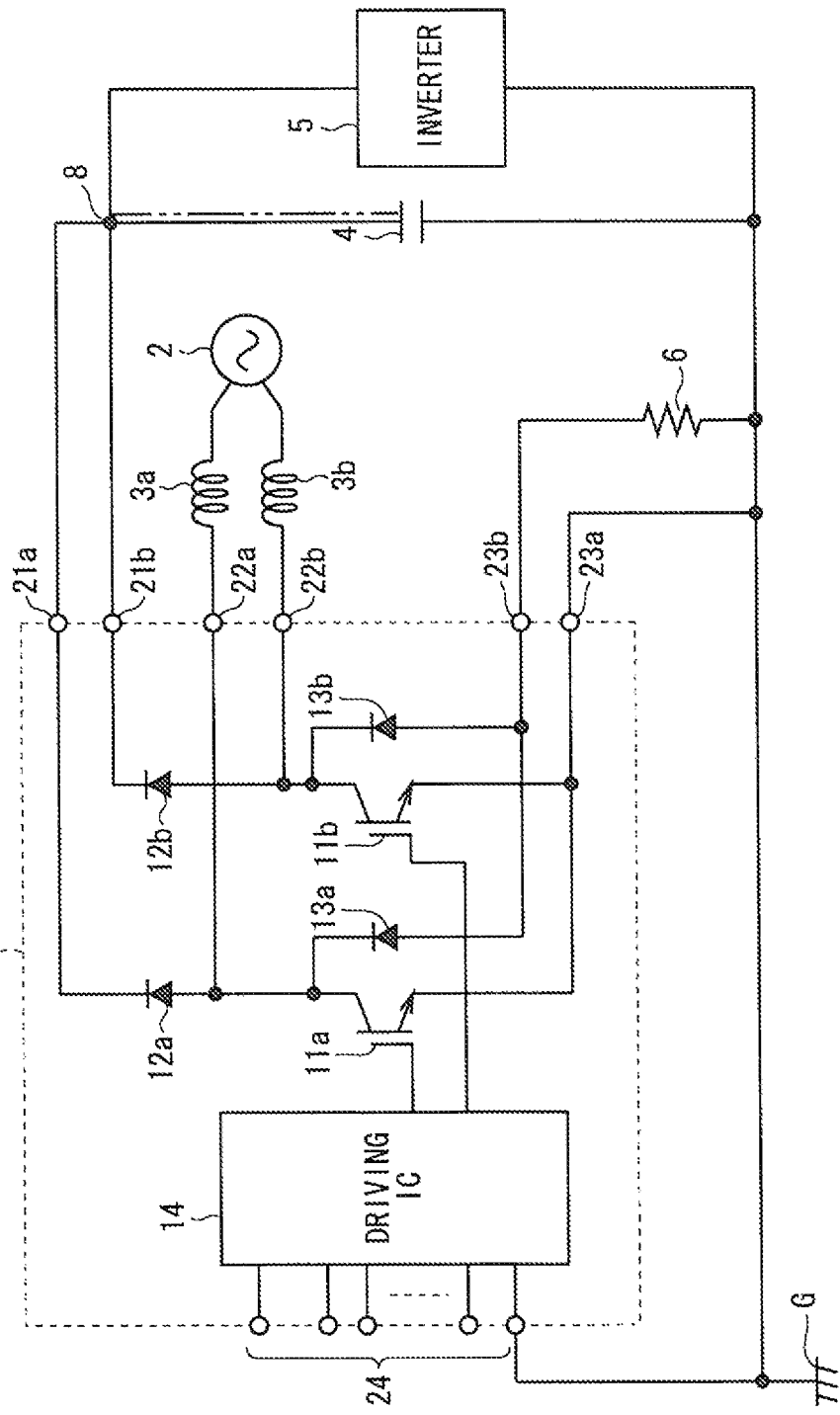
FIG. 1 is a circuit diagram showing the structure of an air conditioner of a first preferred embodiment.

FIG. 1 is a circuit diagram showing the structure of an air conditioner of a first preferred embodiment of the present invention. As shown in FIG. 1, the air conditioner includes a power module 1 having a PFC (power factor correction) function to correct a power factor, an AC power supply 2, inductances 3a and 3b in a pair, a smoothing capacitor 4, an inverter 5, and a resistor 6.

Figure 2:
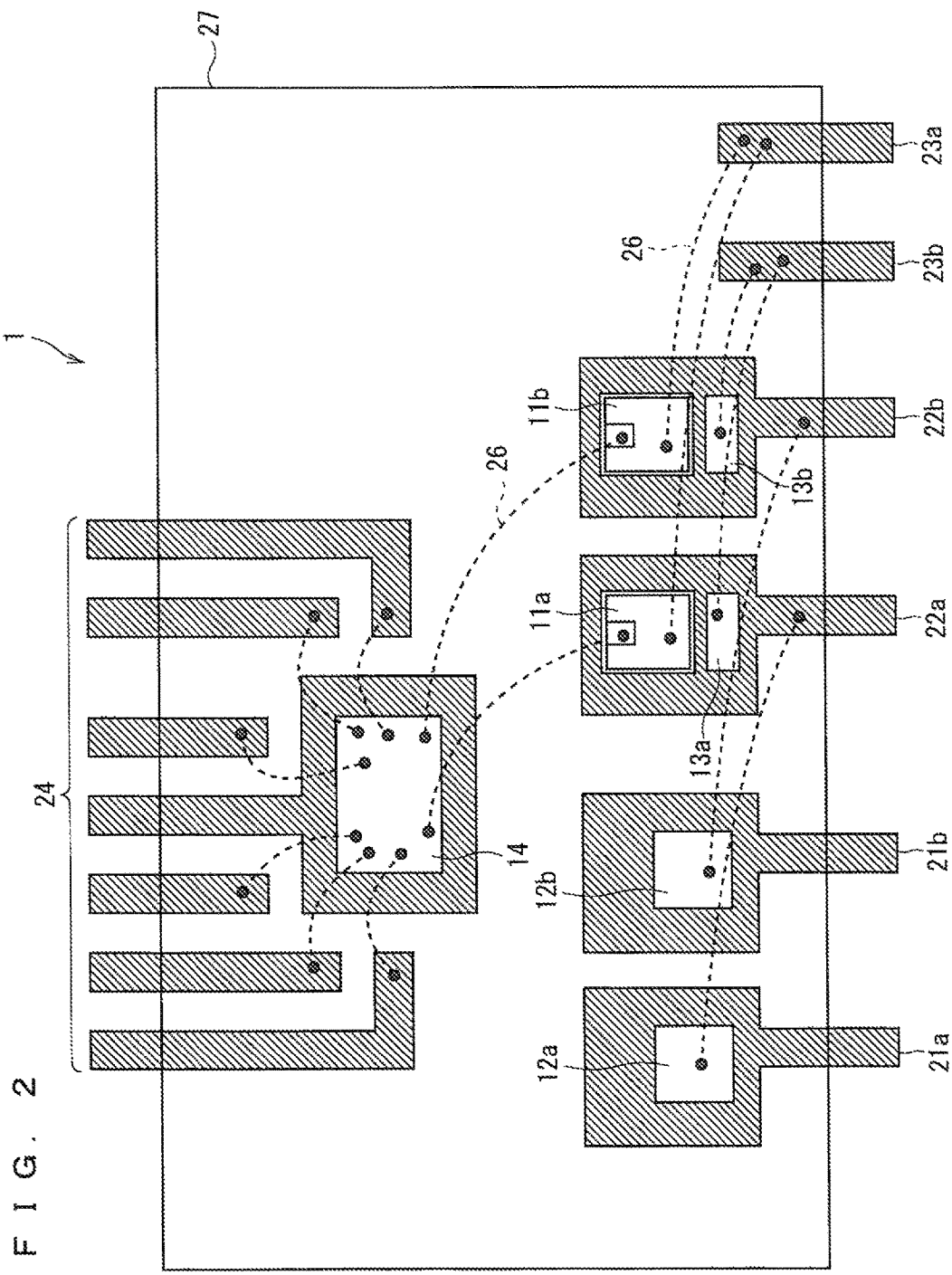
FIG. 2 is a plan view showing the structure of a power module of the first preferred embodiment.

FIG. 2 is a plan view showing the structure of the power module 1 of the first preferred embodiment. The power module 1 includes IGBTs 11a and 11b being Si-IGBTs in a pair, first diodes 12a and 12b in a pair, second diodes 13a and 13b in a pair, a driving IC 14, P terminals 21a and 21b in a pair (terminals in a pair), and terminals 22a, 22b, 23a, 23b and 24. The P terminals 21a and 21b in a pair are output terminals of the power module 1, and are provided independently of each other.

The P terminals 21a and 21b in a pair, and terminals 22a, 22b, 23a, 23b and 24 (hereinafter called "terminals 21a to 24 in a group") are composed of frames made of metal, for example. The IGBTs 11a and 11b, the first diodes 12a and 12b, the second diodes 13a and 13b, and the driving IC 14 (hereinafter called "elements including the IGBT 11a") are provided selectively on the terminals 21a to 24 in a group. The elements including the IGBT 11a, parts of the terminals 21a to 24 in a group, and wire interconnects 26 selectively connecting the elements including the IGBT 11a and the terminals 21a to 24, are covered with a package 27.

The IGBTs 11a and 11b (semiconductor switching elements) are provided on the terminals 22a and 22b respectively. To be specific, the IGBTs 11a and 11b have collector electrodes connected to the terminals 22a and 22b respectively. Further, the IGBTs 11a and 11b have emitter electrodes connected through the wire interconnects 26 to the terminal 23a, and gate electrodes connected through the wire interconnects 26 to the driving IC 14.

The first diodes 12a and 12b have anodes (the other ends) connected through the wire interconnects 26 and the terminals 22a, 22b to the collector electrodes of the IGBTs 11a and 11b respectively to form a reverse-conducting element in the power module 1. The first diodes 12a and 12b are provided on the P terminals 21a and 21b respectively. To be specific, the first diodes 12a and 12b have cathodes (one ends) connected to the P terminals 21a and 21b respectively. In other words, in the first preferred embodiment, the P terminals 21a and 21b are connected to the cathodes (one ends) of the first diodes 12a and 12b respectively.

The second diodes 13a and 13b are provided on the terminals 22a and 22b respectively. To be specific, the second diodes 13a and 13b have cathodes connected to the terminals 22a and 22b respectively. In the first preferred embodiment, the cathodes of the second diodes 13a and 13b, and the collector electrodes of the IGBTs 11a and 11b, are connected to each other through the terminals 22a and 22b respectively. So, the second diodes 13a and 13b have a rectifying function to convert AC power (to be specific, AC power supplied from the AC power supply 2 through the inductances 3a and 3b) to DC power. The second diodes 13a and 13b further have anodes connected through the wire interconnects 26 to the terminal 23b.

The driving IC 14 (driving part) controls the gate voltages of the IGBTs 11a and 11b in a pair to drive the IGBTs 11a and 11b in a pair. The driving IC 14 is connected to the terminal 24.

Referring back to FIG. 1, the AC power supply 2 is connected through the inductances 3a and 3b in a pair to the terminals 22a and 22b in a pair.

The smoothing capacitor 4 (capacitive element) is provided between the P terminals 21a, 21b and the ground G. One side of the smoothing capacitor 4 closer to the terminals 21a and 21b is placed at positive potential, and the opposite side of the smoothing capacitor 4 closer to the ground G is placed at negative potential.

The inverter 5 is connected in parallel to the smoothing capacitor 4. A node 8 between the smoothing capacitor 4 and the inverter 5 is connected to the P terminals 21a and 21b.

An air conditioner related to the air conditioner of the first preferred embodiment (hereinafter called "related air conditioner") is described next by referring to FIGS. 5 and 6. The related air conditioner differs from the air conditioner of the first preferred embodiment in that the collector electrodes of the IGBTs 11a and 11b in a pair are connected through the first diodes 12a and 12b in a pair to one P terminal 21, and that the node 8 between the smoothing capacitor 4 and the inverter 5 is connected to this P terminal 21.

In the air conditioner of the first preferred embodiment and in the related air conditioner, in response to switching operation of either the IGBT 11a or 11b, a surge voltage determined as the product of di/dt and a parasitic inductance is applied to the positive side of the collector electrode of the other one of the IGBTs 11a and 11b. The surge voltage thereby applied triggers an oscillation phenomenon in the power module 1 generated by a series junction capacitance of the first diodes 12a, 12b and the IGBTs 11a and 11b, and a common impedance of an output interconnect. As a result, noise is generated between the gates and the emitters of the IGBTs 11a and 11b during high-speed switching due to dv/dt observed during the oscillation phenomenon.

Figure 5:
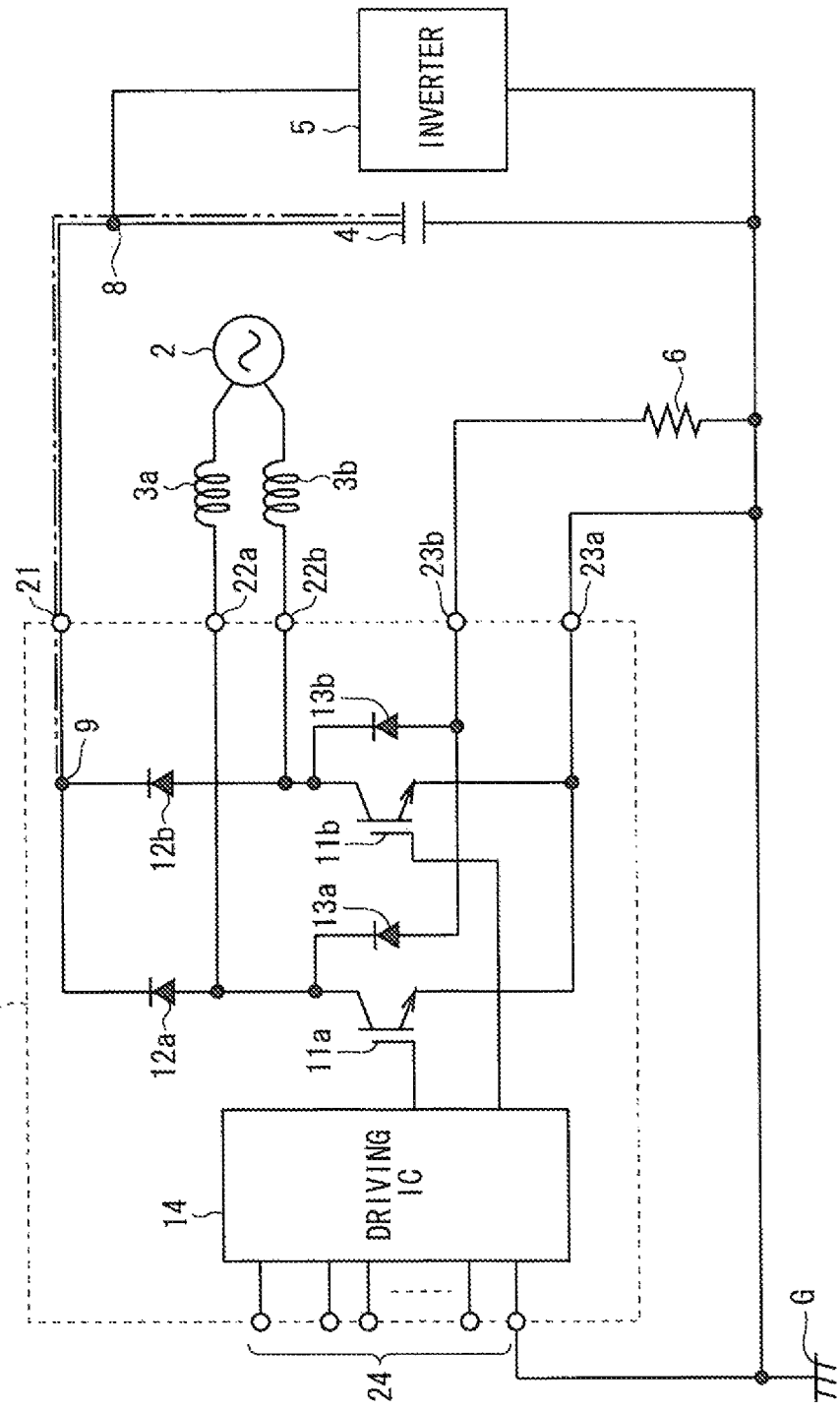
FIG. 5 is a circuit diagram showing the structure of a related air conditioner.
Figure 6:
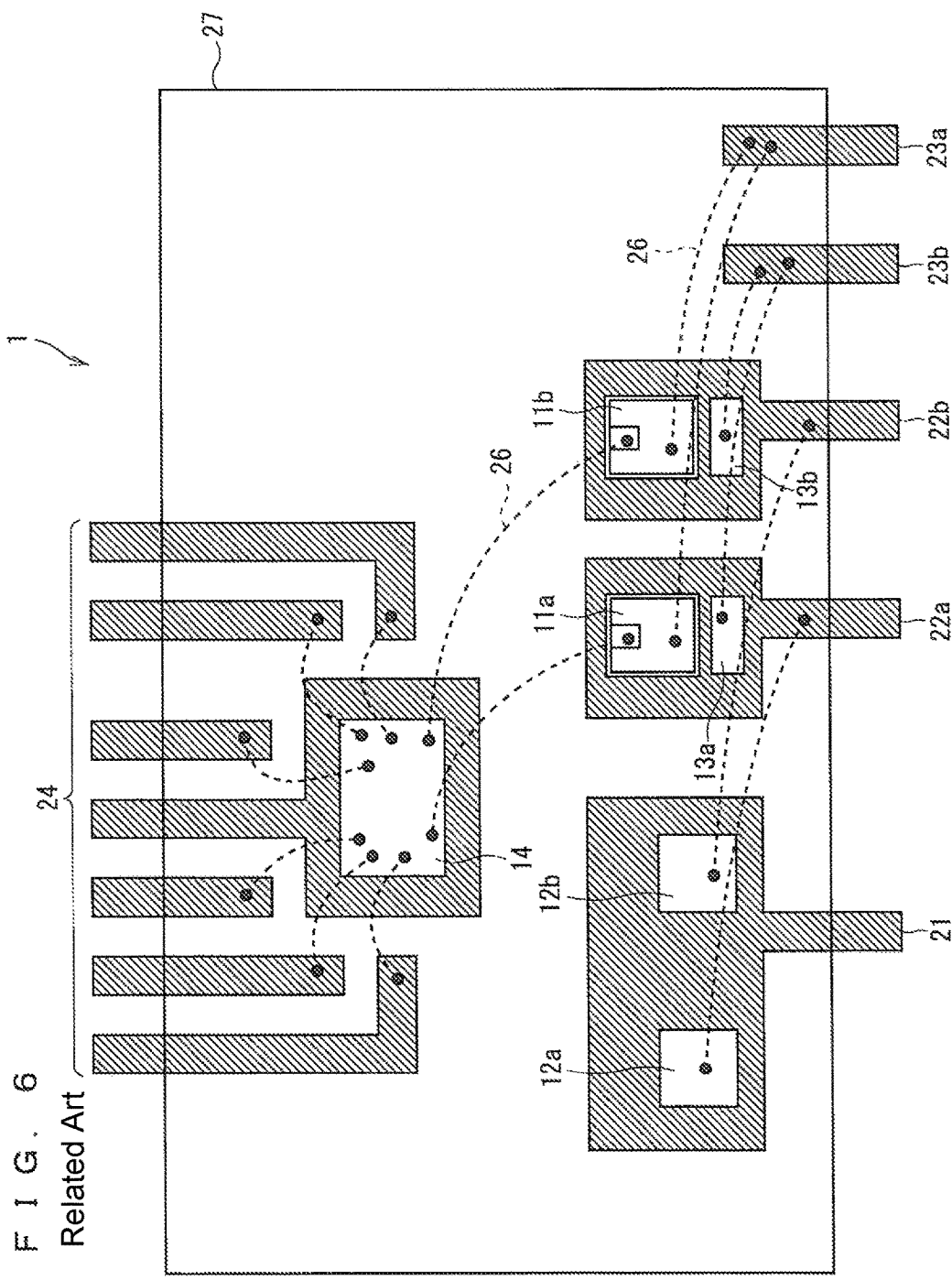
FIG. 6 is a plan view showing the structure of a power module provided in the related air conditioner.

In the related air conditioner, an output interconnect (interconnect indicated by alternate long and two dashed lines in FIG. 5) extending between a node 9 between the first diodes 12a and 12b in a pair and the smoothing capacitor 4 acts as an impedance common to the IGBTs 11a and 11b. This common impedance (parasitic inductance) is a relatively high impedance to increase the aforementioned surge voltage, leading to the increase of the aforementioned noise.

In contrast, in the air conditioner of the first preferred embodiment, the collector electrodes of the IGBTs 11a and 11b in a pair are connected through the first diodes 12a and 12b in a pair to the P terminals 21a and 21b in a pair. Further, the node 8 between the smoothing capacitor 4 and the inverter 5 is connected to the P terminals 21a and 21b in a pair.

In the air conditioner of the first preferred embodiment having the aforementioned structure, an output interconnect extending between the node 8 and the smoothing capacitor 4 (interconnect indicated by alternate long and two dashed lines in FIG. 1) acts as an impedance common to the IGBTs 11a and 11b. This can reduce the common impedance determined by interconnect routing both inside and outside the package 27. As a result, the aforementioned oscillation phenomenon, and eventually, the aforementioned noise generated between the gates and the emitters of the IGBTs 11a and 11b can be suppressed. This makes it possible to suppress generation of malfunction due to noise, so that the driving reliability of the power module 1 is enhanced.

Forming semiconductor switching elements as Si-IGBTs (IGBTs 11a and 11b) as described above makes process of forming a gate oxide film relatively easy. Such formation of semiconductor switching elements also makes a channel resistance low while making a threshold voltage Vth high, so that capacity to withstand malfunction due to the aforementioned noise can be increased.

Semiconductor switching elements are not limited to Si-IGBTs, but they may also include MOS (metal-oxide semiconductor) transistors made of a wide band gap semiconductor. SiC (silicon carbide) MOS being one of wide band gap semiconductors may be used to form semiconductor switching elements, for example. These semiconductor switching elements are capable of realizing switching at higher speed than Si-IGBTs, so that they are used effectively in the PFC power module 1 required to operate at high frequencies.

Using SiC MOS to form semiconductor switching elements results in higher concentration of a drift layer and higher output capacitance than those achieved by Si-IGBTs (as an example, a resultant PN junction capacitance is from about five to about ten times higher than that achieved by the Si-IGBTs), so that this is considered to intensify the aforementioned oscillation phenomenon to some extent. Meanwhile, the power module 1 having the P terminals 21a and 21b in a pair and the air conditioner of the first preferred embodiment are capable of suppressing an oscillation phenomenon as described above, so that an oscillation phenomenon secondarily generated by the use of SiC MOS to form semiconductor switching elements will not be intensified.

Second Preferred Embodiment

Figure 3:
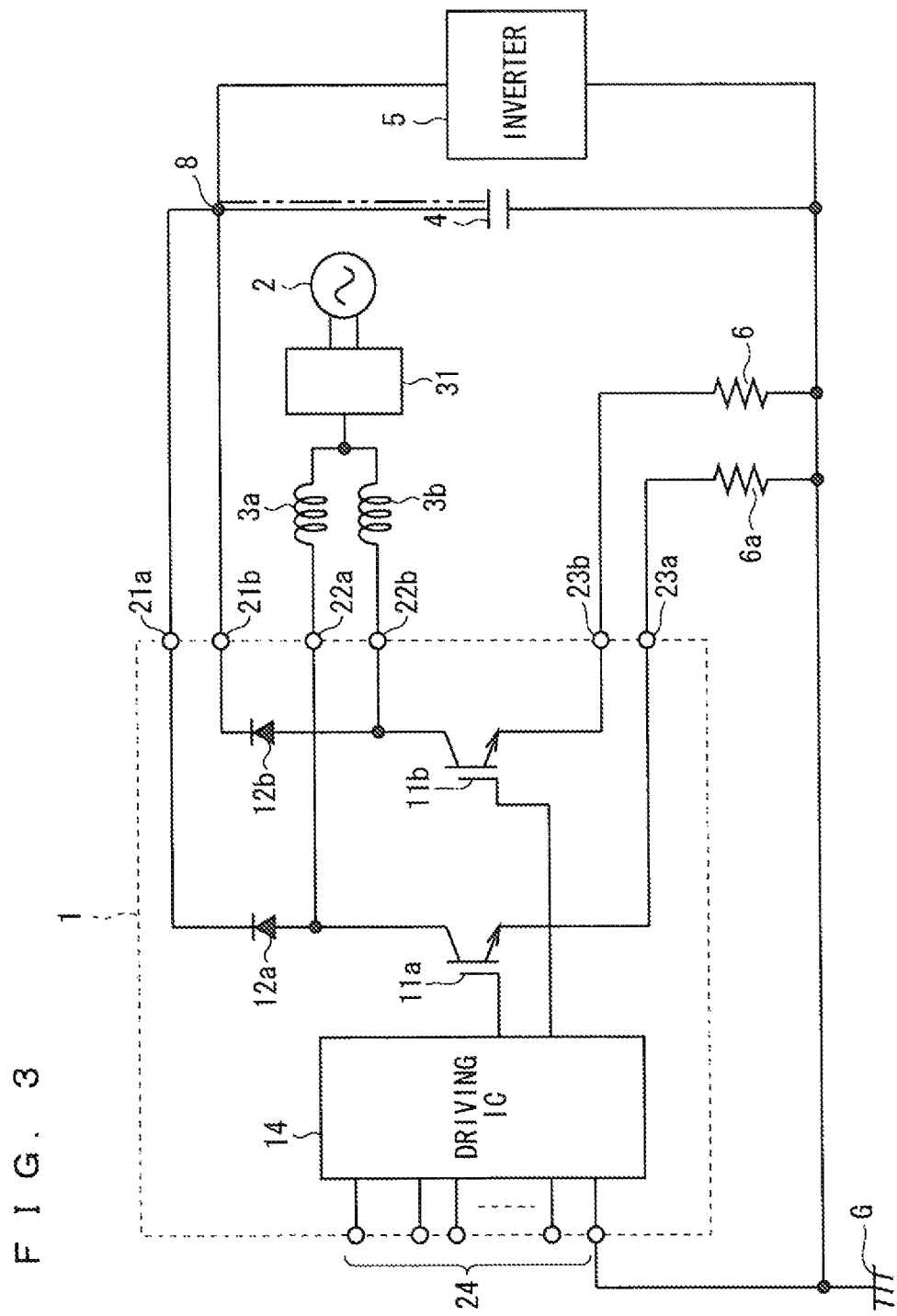
FIG. 3 is a circuit diagram showing the structure of an air conditioner of a second preferred embodiment.
Figure 4:
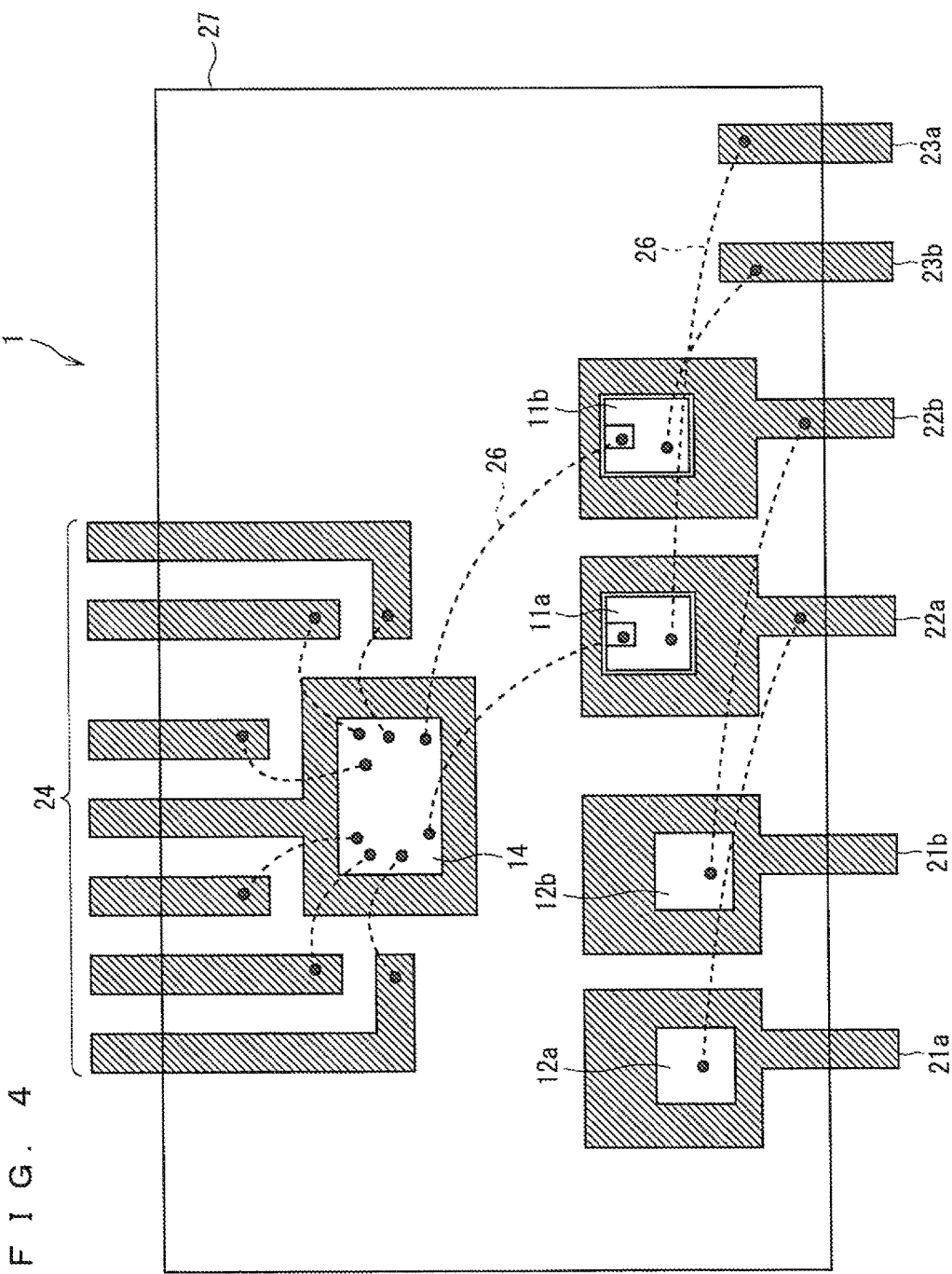
FIG. 4 is a plan view showing the structure of a power module of the second preferred embodiment.

FIG. 3 is a circuit diagram showing the structure of an air conditioner of a second preferred embodiment of the present invention. FIG. 4 is a plan view showing the structure of a power module provided in the air conditioner of FIG. 3. Constituent elements of the air conditioner of the second preferred embodiment same as or similar to those described in the first preferred embodiment are identified by the same reference numbers. The description of the second preferred embodiment is intended mainly for differences from the first preferred embodiment.

The air conditioner of the second preferred embodiment includes a diode bridge 31 provided between the AC power supply 2 and the inductances 3a and 3b in a pair, a resistor 6a provided between the terminal 23a and the ground G, and structure of the air conditioner of the first preferred embodiment.

The power module 1 of the second preferred embodiment provides a difference between phases, and has a PFC function responsive to an interleaved system to cancel out ripples and the like. Unlike in the structure of the power module 1 of the first preferred embodiment, in the structure of the power module 1 of the second preferred embodiment, the second diodes 13a and 13b for rectification are omitted, and the emitter electrode of the IGBT 11b is connected through the wire interconnect 26 not to the terminal 23a but to the terminal 23b.

In the air conditioner of the second preferred embodiment having the aforementioned structure, an output interconnect extending between the node 8 and the smoothing capacitor 4 (interconnect indicated by alternate long and two dashed lines in FIG. 3) acts as an impedance common to the IGBTs 11a and 11b. This can reduce the common impedance determined by interconnect routing both inside and outside the package 27. As a result, like in the air conditioner of the first preferred embodiment, the aforementioned oscillation phenomenon, and eventually, the aforementioned noise generated between the gates and the emitters of the IGBTs 11a and 11b can be suppressed. This makes it possible to suppress generation of malfunction due to noise, so that the driving reliability of the power module 1 is enhanced.

In the second preferred embodiment, semiconductor switching elements are not limited to IGBTs (IGBTs 11a and 11b), but they may also include MOS (metal-oxide semiconductor) transistors made of a wide band gap semiconductor such as SiC (silicon carbide). SiC MOS transistors are capable of realizing switching at higher speed than Si-IGBTs, so that they are used effectively in the PFC power module 1 required to operate at high frequencies.

The preferred embodiments of the present invention can be combined freely, and each of the preferred embodiments can be modified or omitted where appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power module having a PFC (power factor correction) function, comprising:
   a pair of semiconductor switching elements including respective transistors made of a wide band gap material;
   a pair of first diodes each having a first end and a second end, the first end of each first diode connected to a power terminal of a respective semiconductor switching element, the first diodes forming a reverse-conducting element;
   a pair of second diodes each having a first end and a second end, the first end of each second diode connected to the power terminal of a respective semiconductor switching element, the second diodes having a rectifying function;
   a driving part that drives said pair of semiconductor switching elements;
   a package covering said pair of semiconductor switching elements, said pair of first diodes, said pair of second diodes, and said driving part; and
   a pair of rectified output terminals extending independently of each other from the respective second ends of the first diodes to and outwardly from the periphery of the package, the rectified output terminals being different from said power terminals and connected to the second ends of said first diodes, respectively, the second ends of said first diodes being opposite to the first ends of said first diodes to which said pair of semiconductor switching elements are respectively connected.

2. The power module according to claim 1, wherein said transistors are MOS (metal-oxide semiconductor) transistors.

3. The power module according to claim 1, wherein said wide band gap semiconductor includes SiC (silicon carbide).

4. An air conditioner, comprising:
   a power module;
   a capacitive element; and
   an inverter connected to said capacitive element,
   said power module being a power module having a PFC (power factor correction) function, including:
      a pair of semiconductor switching elements including respective transistors made of a wide band gap material;
      a pair of first diodes each having a first end and a second end, the first end of each first diode connected to a power terminal of a respective semiconductor switching element, the first diodes forming a reverse-conducting element;
      a pair of second diodes each having a first end and a second end, the first end of each second diode connected to the power terminal of a respective semiconductor switching element, the second diodes having a rectifying function;
      a driving part that drives said pair of semiconductor switching elements;
      a package covering said pair of semiconductor switching elements, said pair of first diodes, said pair of second diodes, and said driving part; and
      a pair of rectified output terminals extending independently of each other from the respective second ends of the first diodes to and outwardly from the periphery of the package, the rectified output terminals being different from said power terminals and connected to the second ends of said first diodes, respectively, the second ends of said first diodes being opposite to the first ends of said first diodes to which said pair of semiconductor switching elements are respectively connected; and
   a node between said capacitive element and said inverter connected to said pair of rectified output terminals.

5. A power module having a PFC (power factor correction) function responsive to an interleaved system, comprising:
   a pair of semiconductor switching elements including respective transistors made of a wide band gap material;
   a pair of diodes each having a first end and a second end, the first end of each diode connected to a power terminal of a respective semiconductor switching element, the diodes forming a reverse-conducting element;
   a driving part that drives said pair of semiconductor switching elements;
   a package covering said pair of semiconductor switching elements, said pair of diodes, and said driving part; and
   a pair of rectified output terminals extending independently of each other from the respective second ends of the diodes to and outwardly from the periphery of the package, the rectified output terminals being different from said power terminal and connected to the second ends of said diodes, respectively, the second ends being opposite to the first ends of said diodes to which said pair of semiconductor switching elements are respectively connected.

6. The power module according to claim 5, wherein said transistors are MOS (metal-oxide semiconductor) transistors.

7. The power module according to claim 5, wherein said wide band gap semiconductor includes SiC (silicon carbide).

8. An air conditioner, comprising:
a power module;
a capacitive element; and
an inverter connected to said capacitive element,
said power module being a power module having a PFC (power factor correction) function responsive to an interleaved system, including:
  a pair of semiconductor switching elements including respective transistors made of a wide band gap material;
  a pair of diodes each having a first end and a second end, the first end of each diode connected to a power terminal of a respective semiconductor switching element, the diodes forming a reverse-conducting element;
  a driving part that drives said pair of semiconductor switching elements;
  a package covering said pair of semiconductor switching elements, said pair of diodes, and said driving part; and
  a pair of rectified output terminals extending independently of each other from the respective second ends of the diodes to and outwardly from the periphery of the package, the rectified output terminals being different from said power terminals and connected to the second ends of said diodes, respectively, the second ends being opposite to the first ends of said diodes to which said pair of semiconductor switching elements are respectively connected; and
  a node between said capacitive element and said inverter connected to said pair of rectified output terminals.

9. The power module according to claim 1, wherein the pair of semiconductor switching elements are arranged in parallel.

10. The power module according to claim 9, wherein the power terminals of the pair of semiconductor switching elements are coupled to respective inductive elements.

11. The power module according to claim 9, wherein other power terminals of the pair of semiconductor switching elements are electrically connected to ground.

12. The power module according to claim 9, wherein other power terminals of the pair of semiconductor switching elements are electrically connected to one another.

13. The power module according to claim 1, wherein only said second ends among said pair of first diodes are respectively connected to said pair of semiconductor switching elements.

14. The power module according to claim 5, wherein only said second ends among said pair of diodes are respectively connected to said pair of semiconductor switching elements.

15. The power module according to claim 1, wherein the first ends of the first diodes are anodes, the second ends of the first diodes are cathodes, the first ends of the second diodes are cathodes, and the second ends of the second diodes are anodes.

16. The power module according to claim 5, wherein the first ends of the diodes are anodes, and the second ends of the diodes are cathodes.

* * * * *